United States Patent [19]

Estes

[11] Patent Number: 5,383,094
[45] Date of Patent: Jan. 17, 1995

[54] CONNECTION LEAD STUCTURE FOR SURFACE MOUNTABLE PRINTED CIRCUIT BOARD COMPONENTS

[75] Inventor: Howard S. Estes, Austin, Tex.
[73] Assignee: Dell USA, L.P., Austin, Tex.
[21] Appl. No.: 144,454
[22] Filed: Oct. 28, 1993
[51] Int. Cl.⁶ .............................................. H01R 9/00
[52] U.S. Cl. .................... 361/773; 361/772; 361/774; 361/776; 439/68; 439/70
[58] Field of Search ............... 361/772, 773, 774, 776; 174/52.4, 260, 63; 439/68, 70, 72

[56] References Cited

U.S. PATENT DOCUMENTS 5,034,802 7/1991 Liebes, Jr. et al. .................... 357/74
5,214,563 5/1993 Estes .................... 361/386

Primary Examiner—Leo P. Picard
Assistant Examiner—Young Whang
Attorney, Agent, or Firm—James Huffman; Richard Konnecker

[57] ABSTRACT

A specially designed electronic component is surface mounted on a printed circuit board substrate member having a spaced series of electrically conductive circuitry connection portions disposed on a side surface thereof. The electronic component has a body portion with a spaced series of elongated metal lead members fixedly secured thereto and projecting outwardly therefrom. Longitudinal portions of the lead members are soldered to the circuitry connection portions. Side surface areas of these longitudinal portions are clad with a second metal material having a coefficient of thermal expansion substantially different than that of the underlying longitudinal lead member portions. During fabrication of the circuit board a solder paste material is deposited on the circuitry connection portions and the lead member longitudinal portions are placed in a closely adjacent, aligned relationship with the circuitry connection portions. A conventional reflow process is then used to solder the lead members to the circuitry portions. Upon receipt of the soldering heat the longitudinal portions of the bimetal lead member structures are thermally deflected toward the circuitry connection portions, thereby automatically compensating for misalignments between the longitudinal lead member portions and the circuitry connection portions.

14 Claims, 5 Drawing Sheets

CONNECTION LEAD STUCTURE FOR SURFACE MOUNTABLE PRINTED CIRCUIT BOARD COMPONENTS

BACKGROUND OF THE INVENTION

The present invention generally relates to printed circuit board apparatus, and more particularly relates to connection lead apparatus used in the surface mounting of electronic components on printed circuit boards.

In the electronics industry there is an increasing need for finer pitch electrical connector leads associated with electronic components that are surface mountable on a side of a printed circuit board. Conventionally, these connector leads are metal strips that depend from the bottom of the body or housing portion of their associated electronic component and have outwardly bent outer end portions with side surfaces solderable to electrically conductive pad or trace portions formed on a side of the substrate body portion of the circuit board. Due to the very small thicknesses of these connector leads they are relatively easily bent and/or twisted away from their intended shapes during shipping or handling.

The result of this undesirable lead deformation is that when the outer end portions of the leads are placed against their underlying board substrate pads for soldering thereto such end portions are not precisely parallel to the facing surfaces of the pads and/or are not in contact therewith. Accordingly, after the lead/pad soldering process (usually a solder reflow process) is carried out one or more of the leads may be inadequately connected to its associated pad or not connected thereto at all.

From the foregoing it can be readily be seen that it would be highly desirable to provide a surface mountable circuit board electronic component with improved solderable connector lead structures that eliminate or at least substantially reduce the above-mentioned problems commonly associated with conventional connector leads of the general type described above. It is accordingly an object of the present invention to provide such improved solderable connector lead structures.

SUMMARY OF THE INVENTION

In carrying out principles of the present invention, in accordance with a preferred embodiment thereof, a printed circuit board has surface-mounted thereon an electronic component with specially designed electrically conductive lead member structures. The circuit board includes a generally planar substrate portion having electrically conductive circuitry disposed on a side surface thereof and having spaced apart connection portions.

The electronic component includes a body or housing portion, and a spaced plurality of elongated, electrically conductive lead members fixedly secured to the component body and projecting outwardly therefrom. The lead members have longitudinal portions positionable, during the fabrication of the circuit board, in aligned, closely adjacent relationships with the spaced apart surface circuitry connection portions and soldered thereto. Each of the lead member longitudinal portions has opposite first and second sides and a first coefficient of thermal expansion.

A deflection material is fixedly secured to the first sides of the lead member longitudinal portions and has a second coefficient of thermal expansion substantially different than the first coefficient of thermal expansion. The deflection material, when the lead member longitudinal portions are placed in the aforementioned closely adjacent relationships with the surface circuitry portions and receive soldering heat, is operative to thermally deflect the lead member longitudinal portions toward their facing surface circuitry connection portions during the soldering process. This built-in thermal deflection of the lead member structures automatically compensates for misalignments between the lead member longitudinal portions and their associated surface circuitry connection portions.

DETAILED DESCRIPTION

Figure 1:
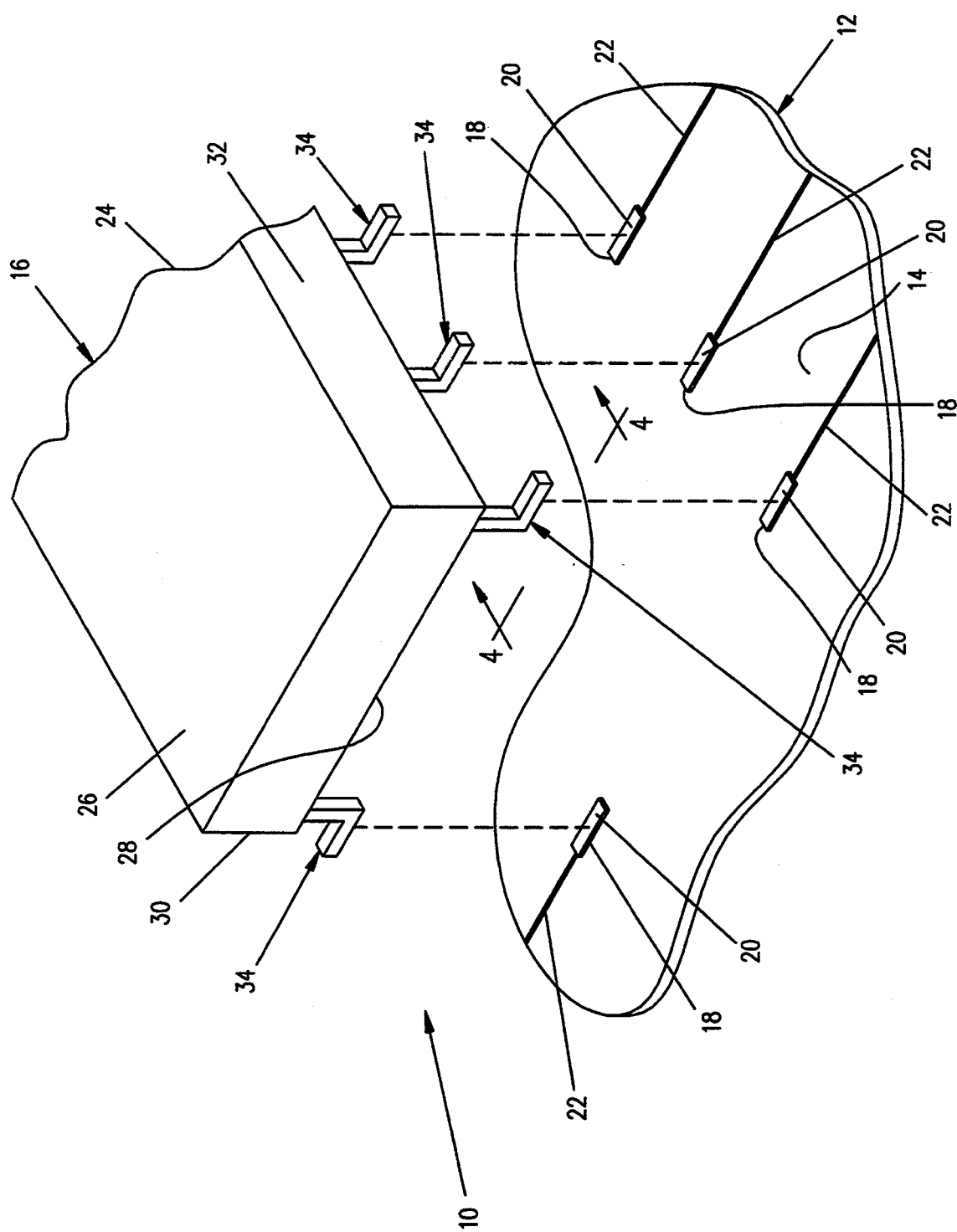
FIG. 1 is a simplified exploded perspective view of a portion of a representative printed circuit board on which an electrical component is surface mounted utilizing specially designed connector leads secured to the component body and embodying principles of the present invention.

Perspectively illustrated in FIG. 1, in a partially exploded, somewhat simplified form, is a portion of a representative printed circuit board 10 embodying principles of the present invention. The circuit board 10 includes a generally planar substrate member 12 having a top side surface 14, and an electronic component 16 that is surface-mounted on the top side of the substrate member. Electrically conductive circuitry is formed on the top side surface 14 of the substrate member 12 and representatively includes a spaced series of electrically conductive surface pads 18, having top side surfaces 20, and a spaced series of electrically conductive surface traces 22 extending outwardly from the pads 18.

For purposes of illustration and discussion the electronic component 16 is shown as being an integrated circuit (IC) package or "chip", but could alternatively be an electronic component of a variety of other types including a connector device or a hybrid lead frame. The component 16 includes a rectangular body or "housing" portion 24 having opposite top and bottom sides 26 and 28.

Fixedly secured to the bottom side 28 of the component body 24, along opposite side edge portions 30 and 32 thereof, are spaced series of specially designed electrically conductive connector leads 34 that project downwardly from the bottom side 28 of the component body 24. In a manner subsequently described herein the connector leads 34 are alignable with, and solderable to, the top sides 20 of the pads 18 to thereby operatively couple the circuitry in the electronic component 16 to the circuitry on the top side 14 of the circuit board substrate body 12.

Figure 4A:
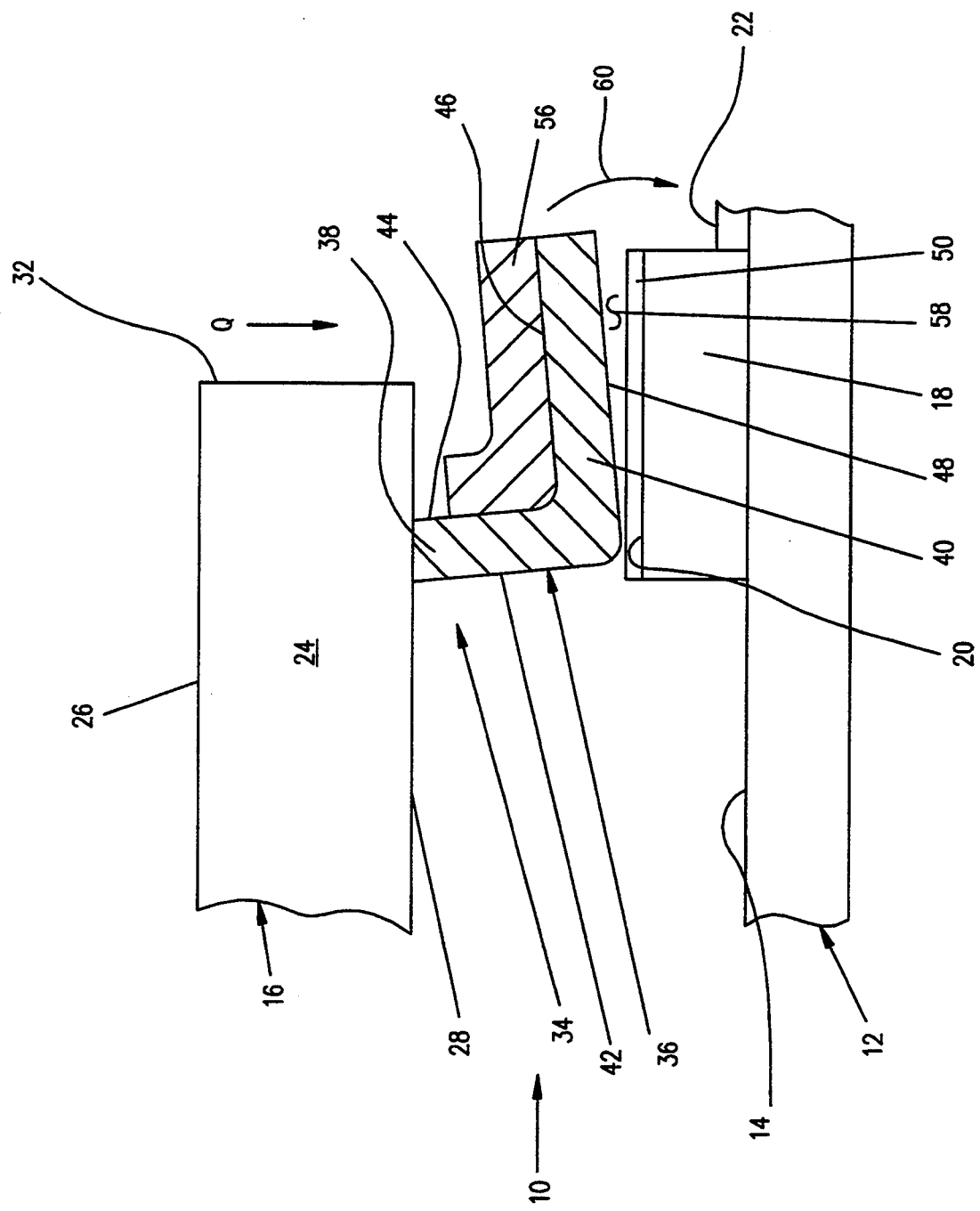
FIGS. 4A and 4B are enlarged scale, simplified cross-sectional views, taken along line 4—4 of FIG. 1, through one of the improved connector leads of the present invention illustrating its structure and unique thermal deflection during soldering thereof to a surface mounted electrically conductive pad portion on the circuit board.

As illustrated in FIG. 4A, each of the connector leads 34 has a body portion formed from an elongated rectangular metal strip member 36 bent to a generally L-shaped configuration and having a vertical leg portion 38 secured to and projecting downwardly from the bottom side 28 of the component body 24, and a horizontal leg portion 40 transversely projecting outwardly beyond the lower end of the vertical leg portion 38. Each vertical leg portion 38 has inner and outer side surfaces 42 and 44, and each horizontal leg portion 40 has top and bottom side surfaces 46 and 48.

To operatively couple the circuitry in the electronic component 16 to the circuitry on the top side 14 of the circuit board substrate member 12, layers of solder paste 50 are deposited on the top sides 20 of the electrically conductive surface pads 18, and the bottom side surfaces 48 of the horizontal let portions 40 are aligned with the pads 18 and placed atop the solder paste layers 50. A suitable hold-down force is appropriately exerted on the component body 24, or the bottom sides 48 of the horizontal leg portions 40 are glued to the solder layers 50, to maintain this alignment. Finally, the connector leads 34 and the solder paste layers 50 are appropriately subjected to soldering heat Q that melts the solder paste layers 50 and conductively secures the connector leg portions 40 to the top sides 20 of the pads 18.

As will readily be appreciated by those of skill in the circuit board fabrication art, for purposes of obtaining suitably high production yields and assuring that a proper connection interface is achieved between each leg portion 40 and its underlying pad surface 20 it is highly desirable that the undersides 48 of the horizontal leg portions 40 be precisely parallel to their corresponding pad top side surfaces 20. However, due to undesirable deformation of the connector leads (for example during handling and shipping), this precise parallel relationship between these facing surfaces, which is particularly important in fine pitch board circuitry is difficult to achieve.

Figure 2:
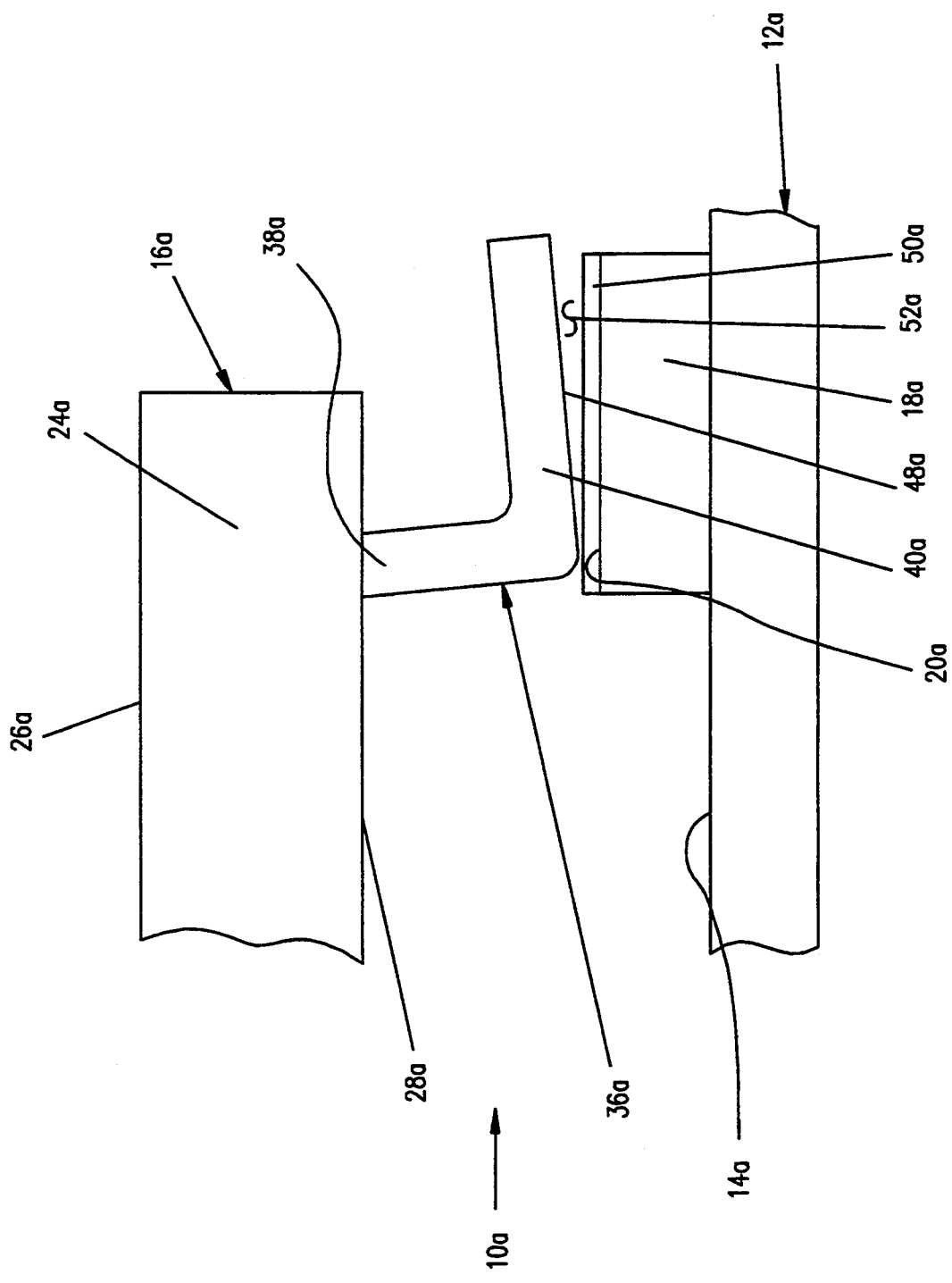
FIG. 2 (PRIOR ART) is a simplified side edge elevational view of a conventional electronic component connector lead illustrating a connection problem associated therewith when its outer end portion is not precisely parallel with the underside of the component body portion.
Figure 3:
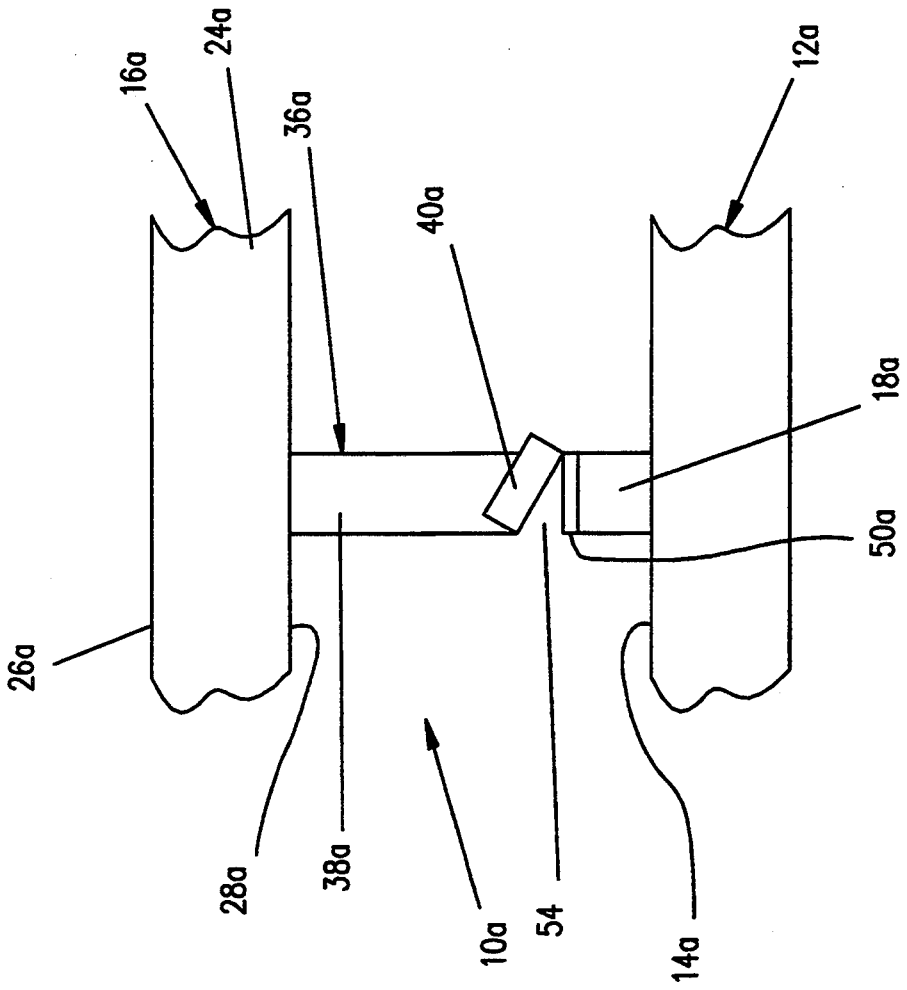
FIG. 3 (PRIOR ART) is a simplified outer end edge elevational view of the conventional connector lead shown in FIG. 2, and illustrates a similar connection problem occurring when the outer end of the conventional connector lead is skewed or twisted.

Before describing the unique construction of the connector leads 34 that substantially alleviates this misalignment problem, the general problem will be more specifically illustrated and described in conjunction with FIGS. 2 and 3 which show, in simplified elevational form, a portion of a conventionally fabricated printed circuit board 10a. For ease in comparing the conventional circuit board 10a to the improved circuit board 10 of the present invention, components in the board 10a similar to those in the board 10 will be given identical reference numerals having the subscripts "a".

Referring initially to FIG. 2, the conventionally fabricated printed circuit board 10a has a substrate body 12a on the top side 14a of which a spaced series of electrically conductive pads 18a are formed. A spaced series of generally L-shaped metal connector lead strips 36a project downwardly from the underside periphery of the component body 24a and have vertical leg portions 38a and horizontal leg portions 40a. As often happens in, for example, shipping or handling, the underside 48a of the horizontal leg portion 40a is not precisely parallel to the underside 28a of the component body 24a, but is upwardly tilted relative thereto. This tilting of the bottom leg surface 48a relative to the bottom component body side surface 28a may arise from an upward bending of leg portion 40a relative to leg portion 38a or (as shown in FIG. 2) an outward bending of the vertical leg portion 38a relative to the component body 24a.

Because of this deformation of the conventional lead strip 36a the bottom side surface 48a of its horizontal leg portion 40a is not parallel to the top pad side surface 20a after being soldered thereto, thereby creating an undesirable gap 52 between the leg 40a and the top side 20a of the pad 18a. A similar gap 54 is created between the leg portion 40a and the pad 18a when the leg portion 40a is twisted relative to the leg portion 38a as shown in FIG. 3.

Referring again to FIG. 4A, in the present invention this undesirable creation in the completed circuit board 10 of an air gap between the horizontal lead leg 40 and the top side of the underlying pad 18 is essentially eliminated by the provision of a layer of cladding metal 56 suitably formed on the top side 46 of the horizontal lead leg portion 40 and extending at least part way up the outer side surface 44 of the vertical lead leg portion 38. The metal cladding layer 56 has a coefficient of thermal expansion greater than the coefficient of thermal expansion of the metal strip member 36.

To illustrate the beneficial connectivity effect of the metal cladding layer 56 it will be assumed that prior to the placement of the lead leg 40 against the solder past layer 50 (FIG. 4A) the vertical leg portion 38 was outwardly bent in a manner such that when the horizontal leg portion 40 is initially placed against the solder paste layer 50 the bottom side surface 48 of the horizontal lead leg portion, as viewed in FIG. 4A, is upwardly and rightwardly tilted relative to the top side surface 20 of the underlying pad 18, thereby creating an air gap 58 (similar to the air gap 52 in FIG. 2) between the solder layer 50 and the bottom side 48 of the leg portion 40.

Figure 4B:
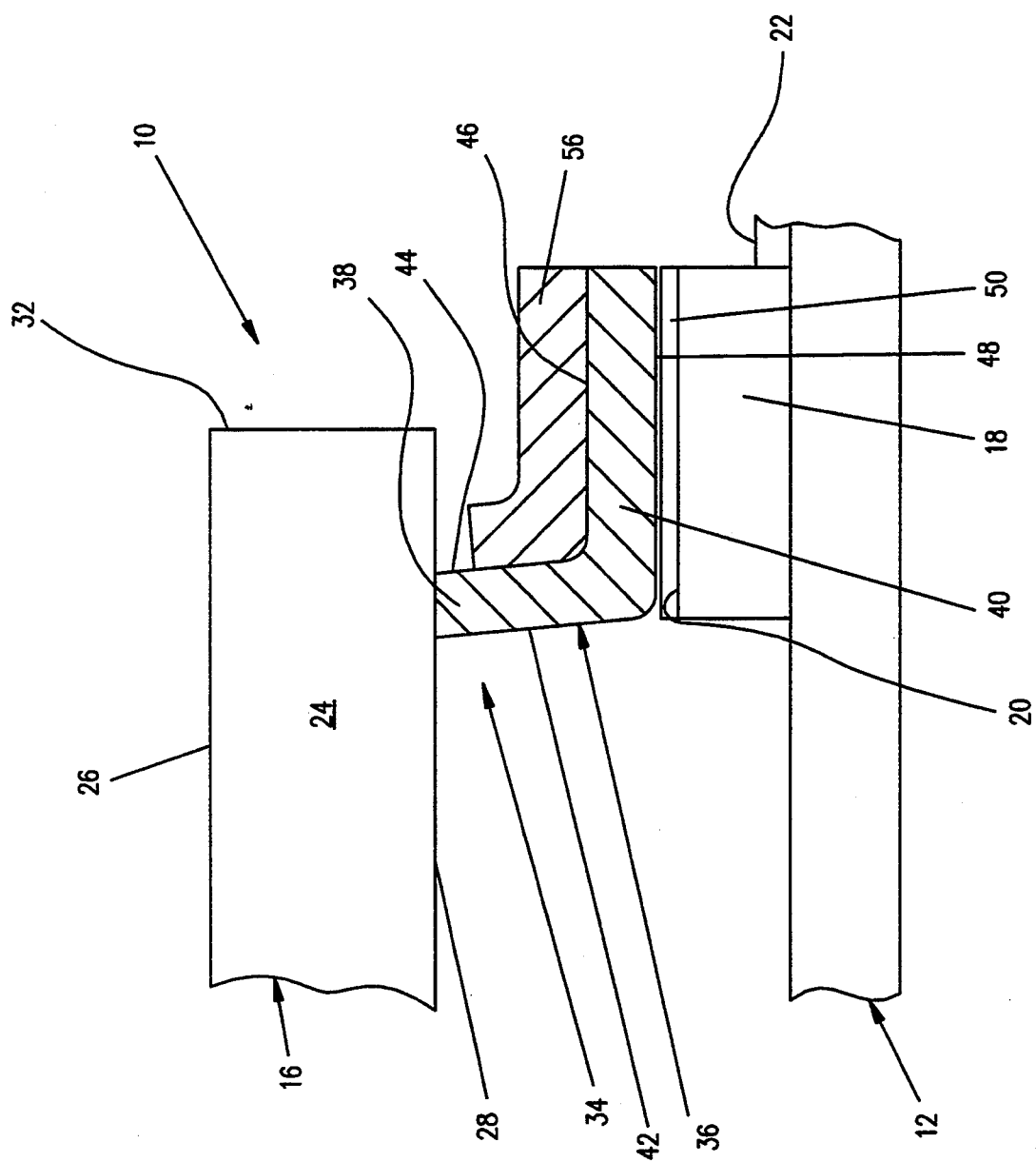

When the soldering heat Q is received by the connector lead 34 the leg portion 40 is laterally deflected downwardly (as indicated by the arrow 60 in FIG. 4A) due to the fact that the coefficient of thermal expansion of the cladding metal 56 is lower than that of the metal strip member 36. This thermally-created lateral deflection of the leg portion 40 brings the bottom side surface 48 of the leg portion 40 into a parallel relationship with the top side surface 20 of the underlying pad 18 as the solder paste 50 is being melted. Accordingly, as shown in FIG. 4B, in the completed circuit board 10 the air gap 58 is eliminated, the bottom side surface 48 of the leg portion 40 is parallel to the top side surface of the pad 18, and essentially the entire facing areas of the pad and leg surfaces 20 and 48 are soldered together. This same type of thermally-created lateral deflection of the leg portion 40 also functions to similarly eliminate an air gap (similar to the air gap 54 shown in FIG. 3) created between the leg 40 and the pad 18 by a lateral twisting of the leg portion 40.

Representatively, the metal used to form the metal strip member 36 is a phosphor/bronze alloy or a beryllium/copper alloy, and the metal cladding material 56 having a lower coefficient of thermal expansion than the metal strip member 36 is a nickel/iron alloy.

While the bimetallic structure of the connector lead 34 just described is designed to thermally create a downward lateral deflection of the leg portion 40, in some instances it might be desirable for connectivity purposes to thermally create an upward deflection of the leg portion 40. This could be accomplished by forming the cladding layer 56 on the top side of the leg 40, or by using a metal cladding layer (on the bottom side of the leg portion 40) having a coefficient of thermal expansion lower than that of the metal strip member. It will also be readily appreciated that this same lateral deflection technique could also be applied to an essentially straight lead member by cladding one side thereof with a metal material having a coefficient of thermal expansion substantially different than that of the lead member upon which it is formed.

The foregoing detailed description is to be clearly understood as being given by way of illustration and example only, the spirit and scope of the present invention being limited solely by the appended claims.

What is claimed is:

1. An electronic component conductively connected to spaced apart portions of surface circuitry on a side of a generally planar printed circuit board substrate portion, said electronic component comprising:
   a body portion;
   a spaced plurality of elongated, electrically conductive lead members secured to said body portion, projecting outwardly therefrom, and having longitudinal portions positionable in aligned, closely adjacent relationships with said spaced apart surface circuitry portions and being solderable thereto, each of said longitudinal portions having opposite first and second sides and a first coefficient of thermal expansion; and
   a deflection material fixedly secured to said first sides of said longitudinal portions of said lead members and having a second coefficient of thermal expansion substantially different than said first coefficient of thermal expansion,
   said deflection material, when said longitudinal portions of said lead members are placed in said closely adjacent relationships with said surface circuitry portions and receive soldering heat, being operative to thermally deflect said longitudinal portions of said lead members toward said surface circuitry portions.

2. The electronic component of claim 1 wherein:
   said lead members are of a first metal material, and
   said deflection material is of a second metal material.

3. The electronic component of claim 2 wherein:
   said first metal material is a phosphor/bronze alloy.

4. The electronic component of claim 2 wherein:
   said first metal material is a beryllium/copper alloy.

5. The electronic component of claim 2 wherein:
   said second metal material is a nickel alloy.

6. The electronic component of claim 1 wherein:
   said second coefficient of thermal expansion is substantially less than said first coefficient of thermal expansion.

7. The electronic component of claim 1 wherein:
   said body portion has a bottom side surface,
   each of said lead members has a generally L-shaped configuration defined by transverse first and second leg portions, and opposite first and second side surfaces respectively extending along said first and second leg portions, said first leg portion being secured to said body portion.

8. The electronic component of claim 7 wherein, on each of said lead members:
   said deflection material is disposed on one of said opposite first and second side surface and extends along said second leg portion and at least part of said first leg portion.

9. The electronic component of claim 8 wherein: the portions of said first side surfaces disposed on said second leg portions face in a generally upward direction relative to said body portion, and
   said deflection material is disposed on said first side surfaces.

10. A method of fabricating a printed circuit board comprising the steps of:
    providing a substrate body having a side surface thereon;
    disposing electrically conductive circuitry on said side surface, said circuitry having mutually spaced apart connection portions;
    providing a surface mountable electronic component having a body portion to which a spaced series of outwardly projecting, electrically conductive lead members are fixedly secured, said lead members having longitudinal portions solderable to said circuitry connection portions and being constructed to thermally deflect in predetermined directions relative to said body portion in response to receipt of soldering heat;
    placing said longitudinal lead member portions in closely adjacent aligned relationships with said circuitry connection portions;
    positioning a solder material between said circuitry connection portions and said longitudinal lead member portions; and
    applying heat to said longitudinal lead member portions, said solder material and said circuitry connection portions to thermally deflect said longitudinal lead member portions into engagement with said circuitry connection portions and solder the thermally deflected longitudinal lead member portions to said circuitry connection portions.

11. A printed circuit board comprising:
    a generally planar substrate portion having a side surface thereon;
    electrically conductive circuitry disposed on said side surface and having mutually spaced apart connection portions;
    an electronic component including:
        a body portion disposed over said side surface of said substrate portion,
        a spaced series of lead members formed from a first metal material having a first coefficient of thermal expansion, each of said lead members having a first end portion fixedly secured to said body portion and projecting downwardly therefrom, a second end portion transversely projecting outwardly from said first end portion and being soldered to one of said circuitry connection portions, and first and second opposite side surfaces extending along said first and second leg portions and facing in directions generally perpendicular to said side surface of said substrate portion, and a metal cladding material disposed on one of said first and second side surfaces and extending along said second end portion and at least a portion of said first end portion, said metal cladding material having a second coefficient of thermal expansion substantially different than said first coefficient of thermal expansion.

12. The printed circuit board of claim 11 wherein:
    the portion of said first side surface on the second leg portion of each of said lead members faces generally upwardly,
    said metal cladding material is disposed on said first side surface of each of said lead members, and said second coefficient of thermal expansion is substantially greater than said first coefficient of thermal expansion.

13. The printed circuit board of claim 11 wherein:
said lead members are formed from a phosphor/bronze alloy, and
said cladding material is formed from a nickel/iron alloy.

14. The printed circuit board of claim 11 wherein:
said lead members are foraged from a beryllium/copper alloy, and
said cladding material is formed from a nickel/iron alloy.

* * * * *